United States Patent [19]
Kato

[11] Patent Number: 5,844,918
[45] Date of Patent: Dec. 1, 1998

[54] DIGITAL TRANSMISSION/RECEIVING METHOD, DIGITAL COMMUNICATIONS METHOD, AND DATA RECEIVING APPARATUS

[75] Inventor: Masami Kato, Gifu, Japan

[73] Assignee: Sanyo Electric Co., Ltd., Osaka, Japan

[21] Appl. No.: 758,631

[22] Filed: Nov. 27, 1996

[30] Foreign Application Priority Data

Nov. 28, 1995 [JP] Japan ..................................... 7-309560

[51] Int. Cl.[6] ........................... H03M 13/00; H04L 1/16
[52] U.S. Cl. .......................................... 371/35; 371/37.02
[58] Field of Search .......................... 371/35, 37.7, 37.02

[56] References Cited

U.S. PATENT DOCUMENTS

| | | | |
|---|---|---|---|
| 5,432,787 | 7/1995 | Chethik ...................................... | 370/79 |
| 5,471,503 | 11/1995 | Altmaier et al. ........................ | 375/202 |
| 5,526,399 | 6/1996 | Kameda .................................... | 379/58 |
| 5,537,416 | 7/1996 | MacDonald et al. ..................... | 371/32 |

FOREIGN PATENT DOCUMENTS 7-67175  3/1995  Japan .

OTHER PUBLICATIONS

Kressel et al., "Adaptive Forward Error Correction for Fast Data Transmission over the Mobile Radio Channel", EUROCON '88, pp. 170–173, Dec. 1988.

Shiozaki, "Adaptive Type–II Hybrid ARQ System Using BCH Codes", IEICE Trans. Fundamentals, vol. E75–A, No. 9, Sep. 1992, pp. 1071–1075.

Jalali et al., "Performance of Data Protocols for In–Building Wirelesss Systems", 1st Intl. Conf. on Universal Personal Communications, pp. 407–411, Dec. 1992.

Bigloo et al., A Robust Rate–Adaptive Hybrid ARQ Scheme for Frequency–Hopped Spread–Spectrum Multiple–Access Communication Systems, IEEE J. on Selected Areas in Communications, vol. 12, No. 5, pp. 917–924, Apr. 1994.

*Primary Examiner*—Stephen M. Baker
*Attorney, Agent, or Firm*—Armstrong, Westerman, Hattori, McLeland & Naughton

[57] ABSTRACT

An error correcting code including of basic data and a BCH-based parity code appended thereto is divided into smaller packets. An error detecting code is appended to each of the thus-divided packets, so that transmission basic data is formed. When the transmission basic data is received, the basic data and a BCH-based parity code are derived from the transmission basic data. Error correcting is carried out with respect to the overall transmission basic data. An error detecting operation is carried out with respect to each packet using the error detecting code. If a packet is found to contain errors, a request for retransmission of that packet will be sent to the sending side.

38 Claims, 10 Drawing Sheets

Fig. 7a RECEIVED DATA PACKETS

Fig. 7b TRANSMISSION BASIC DATA (AD) COMPLETE WITH A BCH-BASED PARITY CODE

Fig. 7c ERROR-CORRECTED DATA

Fig. 7d ERROR CHECK

DIGITAL TRANSMISSION/RECEIVING METHOD, DIGITAL COMMUNICATIONS METHOD, AND DATA RECEIVING APPARATUS

BACKGROUND OF THE INVENTION

1. Field of the Invention

The present invention relates to a hybrid FEC/ARQ technique.

2. Description of the Related Art

FEC (Forward Error Correction) and ARQ (Automatic Repeat Request) have been known as error control techniques in the field of digital communications.

FEC is a method of appending an error correcting parity code to data at the sending side so as to generate an error correcting code, whereby errors arising in a transmission line, or the like, can be corrected at the receiving side by means of the error correcting code. BCH (Bose-Chaudhuri-Hocquenghem) codes are well known as such error correcting codes.

ARQ is a method of sending data after having appended error detecting codes to the data at the sending side and requesting retransmission of that data from the sending side upon detection of errors by means of the error detecting codes at the receiving side.

As is well known, FEC has advantages and disadvantages. Similarly, ARQ also has advantages and disadvantages. Several improvements to these methods have already been proposed as shown below; namely, (a) the selection of the type of FEC depending on the quality of a transmission line: (b) the changing of the length of a data packet used in ARQ; (c) switching between FEC and ARQ depending on the quality of the transmission line; (d) a combination of FEC and ARQ in which only the data FEC cannot correct is requested for retransmission by ARQ (hybrid FEC/ARQ); (e) switching between a transmission rate, FEC, ARQ, and a hybrid FEC/ARQ depending on the quality of the transmission line; and (f) the changing of the length of a data packet used in the hybrid FEC/ARQ depending on the quality of the transmission line.

With reference to FIGS. 1 to 3, one example of a well known FEC/ARQ will be described.

A conventional hybrid PEC/ARQ communications system is provided with a data transmitter A and a data receiver B. The data transmitter A comprises an input terminal 110, a packet assembly circuit 112, data memory 122, a transmit/receive circuit 124, and a retransmission request circuit 126, as shown in FIG. 1. Further, the packet assembly circuit 112 is comprised of a segmentation circuit 114, an error detecting code addition circuit 116, a BCH-based parity code addition circuit 118, and a header addition circuit 120.

The input terminal 110 receives basic data BD, as shown in FIG. 2a. The segmentation circuit 114 divides the basic data BD into a fixed length, as shown in FIG. 2b. At this time, dummy data is appended to a data segment which is shorter than the fixed length. The error detecting code addition circuit 116 appends an error detecting code to the thus-segmented data, as shown in FIG. 2c. A CRC code is used herein as the error detecting code. The BCH-based parity code addition circuit 118 appends a BCH-based parity code to the data complete with the CRC code, as shown in FIG. 2d. A BCH code is used as an error correcting code. The error correcting code may be formed by appending the BCH-based parity code to only the basic data segment. However, it is more preferable to create the error correcting code by appending the BCH-based parity code to the thus-segmented basic data complete with the CRC code. The header addition circuit 120 generates a transmission data packet by further appending a packet header to the data segment complete with the CRC code and the BCH-based parity code, as shown in FIG. 2e.

The data memory 122 stores the transmission data packet generated by the packet assembly circuit 112. This data memory 122 maintains the transmission data packet even after having sent it to the receiving side. The reason for this is that it is possible for the data memory 122 to quickly retransmit the transmission data packet if it receives a retransmission request from the receiving side.

The transmit/receive circuit 124 sends the transmission data packet stored in the data memory 122 to the data receiver B, as well as receiving a retransmission request from the data receiver B. Upon receipt of a retransmission request from the data receiver B via the transmit/receive circuit 124, the retransmission request circuit 126 causes the data packet that is the object of the retransmission request to be output to the transmit/receive circuit 124 from the data memory 122.

The data receiver B is provided with a transmit/receive circuit 128, an error correcting circuit 130, and an error detecting circuit 132, as shown in FIG. 1.

The transmit/receive circuit 128 receives data from the data transmitter A, as well as sending a retransmission request to the data transmitter A. The error correcting circuit 130 carries out an error correcting operation using the BCH code. The error detecting circuit 132 detects errors in the data thus corrected by the error correcting circuit 130 using the CRC code. If errors are detected, a request for retransmission of the data packet found to contain errors will be sent to the data transmitter A via the transmit/receive circuit 128.

The operation of the previously-described conventional hybrid FEC/ARQ communications system will be briefly described.

The basic data input through the input terminal 110 of the data transmitter A is received by the packet assembly circuit 112. To begin with, the basic data is divided into data segments so that they can be assembled into packets. The CEC code and the BCH-based parity code are appended to each data segment. In short, the error detecting code addition circuit 116 appends an error detecting code to the data segment, and the BCH-based parity code addition circuit 118 appends a BCH-based parity code to the data segment complete with the error detecting code. Further, the header addition circuit 120 appends a packet header to the data segment complete with the error detecting code and the BCH-based parity code. The data is thus assembled into a packet and is sent to the data receiver B by way of the data memory 122 and the transmit/receive circuit 124.

In the data receiver B, the transmit/receive circuit 128 receives the data, Then, the error correcting circuit 130 carries out an error correcting operation using the BCH code, as shown in step S11 of FIG. 3. As a result, there may be a case where errors arising in data transmission can be corrected. Next, the error detecting circuit 132 carries out an error detecting operation using the CRC code, as shown in step S12 of FIG. 3. If the data packet is found to contain errors, this data packet will be discarded and requested for retransmission from the data transmitter A, as shown in steps S13 and S14 of FIG. 3.

If the data transmitter A receives the retransmission request, the transmit/receive circuit 124 will retransmit the data packet stored in the data memory 122 to the transmit/receive circuit 128. It is also possible to arrange the communications system so as to carry out the packet assembly processing again from the beginning.

As described above, the conventional hybrid FEC/ARQ communications system carries out the FEC and ARQ operations for each data block (i.e., a packet or cell) during communication. In short, the receiving side detects errors after having carried out an error correcting operation using FEC every one packet. This means that the data to be subjected to the FEC operation and the data packet have the same length. If errors are detected from the data packet, a request for retransmission of that data packet from the sending side is requested.

SUMMARY OF THE INVENTION

The primary object of the present invention is to provide a hybrid FEC/ARQ system which properly operates without execution of FEC on a packet-by-packet basis. In other words, the object of the present invention is to realize a hybrid FEC/ARQ system by utilization of an error correcting code in the case where the error correcting cods having a parity code appended thereto from the outset is transmitted.

Another object of the present invention is to provide a hybrid FEC/ARQ system which properly operates even in the case where data to be subjected to an FEC operation and a data packet are different from each other in length.

Still another object of the present invention is to improve the throughput characteristics of the above-suggested hybrid FEC/ARQ system.

A further object of the present invention is to transmit a video signal over a PHS (Personal Handy Phone System) by means of the hybrid FEC/ARQ system of the present invention.

To these ends, according to a first aspect of the present invention, there is provided a digital transmission method for sending a digital signal, comprising:

a division step of dividing an error correcting code which consists of basic data complete with a parity code, into smaller data segments;

an error detecting code addition step of appending an error detecting code to each of the data segments divided in the division step;

a transmission step of sending the data segments complete with the error detecting code on a packet-by-packet basis; and a retransmission step of retransmitting a requested data packet in response to a retransmission request of the data packet from a receiving side.

By virtue of this transmission method, the transmitted data is received and subjected to the error correcting and detecting operations by the receiving side. As a result, even in the case of transmission of the data having an error correcting code appended thereto from the outset, it is possible to implement the hybrid FEC/ARQ system.

According to the second aspect of the present invention, there is provided a digital receiving method for receiving a digital signal, comprising:

a receiving step of receiving transmission data that comprises smaller packets, each having an error detecting code, into which an error correcting code that includes basic data and a parity code appended thereto is divided;

an error correcting step of carrying out an error correcting operation with respect to the overall received basic data using the error correcting code;

an error detecting step of carrying out a detecting operation with respect to at least one packet of the error-corrected basic data; and a request step of requesting retransmission of at least one of the packets found to contain an error, from the sending side.

By virtue of this receiving method, it is possible to provide a hybrid FEC/ARQ system which Properly operates even when FEC is not carried out on a packet-by-packet basis.

According to a third aspect of the present invention, there is provided a digital receiving method for receiving a digital signal, comprising:

a receiving step of receiving transmission data that comprises smaller packets, each having an error detecting code, into which an error correcting code that includes basic data and a parity code appended thereto is divided;

a first error detecting step of carrying out an error detecting operation with respect to at least one packet of the received basic data;

an error correcting step of carrying out an error correcting operation with respect to the overall basic data using an error correcting code when the packet is found to contain an error in the first error detecting step;

a second error detecting step of carrying out an error detecting operation with respect to at least one packet of the error-corrected basic data; and a request step of requesting retransmission of at least one of the packets found to contain an error, from the sending side.

By virtue of this digital transmission method, it is possible to provide a hybrid FEC/ARQ system which Properly operates without execution of FEC on a packet-by-packet basis. Particularly, an error correcting operation is carried out with respect to the data that corresponds to the packet. If the data is found to be free from error, neither an error correcting operation nor a retransmission request will be carried out. As a result, the processing can be simplified.

According to a fourth aspect of the present invention, there is provided a digital communications method for sending a digital signal, comprising:

at the sending end, a division step of dividing an error correcting code which includes of basic data complete with a parity code, into smaller data segments;

an error detecting code addition step of appending an error detecting code to each of the data segments divided in the division step;

a transmission step of sending the data segments complete with the error detecting code on a packet-by-packet basis;

a retransmission step of retransmitting a requested data packet in response to a retransmission request of the data packet from a receiving side;

at the receiving end, a receiving step of receiving the transmission data sent in the transmission step;

an error correcting step of carrying out an error correcting operation with respect to the overall received basic data using the error correcting code;

an error detecting step of carrying out a detecting operation with respect to at least one packet of the error-corrected basic data; and a request step of requesting retransmission of at least one of the packets found to contain an error, from the sending side.

By virtue of the digital communications method, it is possible to put forth a hybrid FEC/ARQ system which properly operates without execution of FEC on a packet-by-packet basis.

In one preferred embodiment, the digital communications method should preferably further comprise a step of carrying out the error correcting operation again with respect to the overall basic data that includes the basic data portion of a retransmitted packet, with use of the error correcting code including the basic data and the parity code, when the packet for which the retransmission request was made is retransmitted from the sending side.

As a result, it is possible to improve the throughput of the digital communications method. Specifically, for example, if a plurality of packets are found to contain errors, retransmission of only one packet will be requested. The overall transmission basic data that includes a retransmitted packet is subjected to the error correcting operation. If all the packets of the data are found to be free from error as a result of the error detecting operation that follows the error correcting operation, the need for retransmission request will be eliminated. Therefore, it is possible to improve the throughput of the digital transmission method.

According to a fifth aspect of the present invention, there is provided a digital communications method, comprising: at the sending end, a division step of dividing an error correcting code which includes data complete with a parity code, into smaller data segments;

an error detecting code addition step of appending an error detecting code to each of the data segments divided in the division step;

a transmission step of sending the data segments complete with the error detecting code on a packet-by-packet basis;

a retransmission stop of retransmitting a requested data packet in response to a retransmission request of the data packet from a receiving side; and at the receiving end, a receiving step of receiving the data transmitted in the transmission step:

a first error detecting step of carrying out an error detecting operation with respect to at least one packet of the received basic data;

a first error correcting step of carrying out an error correcting operation with respect to the overall basic data using an error correcting code when the packet is found to contain an error in the first error detecting step;

a second error detecting step of carrying out an error detecting operation with respect to at least one packet of the error-corrected basic data; and a request step of requesting retransmission of at least one of the packets found to contain an error, from the sending side.

By virtue of this digital communications method, it is possible to provide a hybrid FEC/ARQ system which properly operates without execution of FEC on a packet-by-packet basis. Particularly, an error correcting operation is carried out with respect to the data that corresponds to the packet. If the data is found to be free from error, neither an error correcting operation nor a retransmission request will be carried out. As a result, the processing can be simplified.

In one preferred embodiment, the digital communications method should preferably further comprise:

a repeat of the first error detecting step of carrying out the error detecting operation again with respect to at least one packet of the basic data that includes the basic data portion of a retransmitted packet, when the packet for which the retransmission request was made is retransmitted from the sending side; and a repeat of the error detecting step of again carrying out the error detecting operation with respect to the overall basic data that includes the basic data portion of the retransmitted packet, with use of the error correcting code including the basic data and the parity code, when errors are found as a result of the repeat of the first error correcting step. The data corresponding to the packet is subjected to the repeat of the error correcting operation. If the data is found to be free from error as a result of the repeat of the error detecting operation, neither the error correcting operation nor the retransmission request will be made. Therefore, the processing can be simplified, which in turn enables improvements to the throughput of the digital communications method.

In another preferred embodiment, the basic data should preferably be a video signal, and the video signal should preferably be transmitted in accordance with a TDMA/TDD method in the transmission step. By virtue of this embodiment, the video signal can be applied to PHS transmission.

According to a sixth aspect of the present invention, there is provided a data receiving apparatus that receives data complete with a parity code and an error detecting code, comprising:

a receiving circuit for receiving transmission data that comprises smaller packets, each having an error detecting code, into which an error correcting code consisting of basic data and a parity code appended thereto is divided;

an error correcting circuit for carrying out an error correcting operation with respect to the overall received basic data using the error correcting code;

an error detecting circuit for carrying out an error detecting operation with respect to at least one packet of the error-corrected basic data; and a transmission circuit for requesting retransmission of at least one of the packets found to contain an error, from the sending side.

In this receiving apparatus, the receiving circuit receives the transmission data, and the error correcting circuit carries out an error correcting operation with respect to the received error correcting code. The error detecting circuit carries out an error detecting operation with respect to the data corresponding to the packet of the error-corrected basic data. If the data is found to contain errors as a result of the error detecting operation, the transmission circuit requests retransmission of at least one of the data. As a result, it is possible to provide a hybrid FEC/ARQ system which properly operates without execution of FEC on a packet-by-packet basis.

In one preferred embodiment, if the packet for which the retransmission request was made is retransmitted from the sending side, and the receiving circuit receives that retransmitted packet, the error correcting circuit should preferably carry out the error correcting operation again with respect to the overall basic data that includes the basic data portion of the retransmitted packet, with use of the error correcting code including the basic data and the parity code;

the error detecting circuit should preferably carry out the error detecting operation again with respect to at least one packet of the basic data subjected to the repeat of error correction; and the transmission circuit should preferably request retransmission of at least one of the packets found to contain errors as a result of the repeat of error correction, to the sending side.

According to a seventh aspect of the present invention, there is provided a data receiving apparatus that receives data complete with a parity code and an error detecting code, comprising:

a receiving circuit for receiving transmission data that comprises smaller packets, each having an error detecting code, into which an error correcting code including basic data and a parity code appended thereto is divided;

a first error detecting circuit for carrying out an error detecting operation with respect to at least one packet of the received basic data;

an error correcting circuit for carrying out an error correcting operation with respect to the overall basic data using an error correcting code when the packet is found to contain an error in the first error detecting step;

a second error detecting circuit for carrying out an error detecting operation with respect to at least one packet of the error-corrected basic data; and a transmission circuit for requesting retransmission of at least one of the packets found to contain an error, from the sending side.

In this receiving apparatus, the receiving circuit receives the transmission data, and the first error correcting circuit carries out an error correcting operation. If the transmission data is found to contain errors, the error correcting circuit will carry out an error correcting operation with respect to the received error correcting code. The second error detecting circuit carries out the error detecting operation with respect to at least one packet of the error-corrected basic data. If the basic data is still found to contain errors as a result of the second error detecting operation, the transmission circuit requests retransmission of at least one of the data. As a result, it is possible to put forth a hybrid FEC/ARQ system which properly operates without execution of FEC on a packet-by-packet basis. Further, the error detecting operation is carried out on a packet-by-packet basis. If the packets are found to be free from error, neither the error correcting operation nor the retransmission request will be made, which in turn enables simplification of the processing.

In one preferred embodiment, if the packet for which the retransmission request was made is retransmitted from the sending side, and the receiving circuit receives that retransmitted packet, the first error detecting circuit should preferably carry out the error detecting operation again with respect to at least one packet of the basic data that includes the basic data portion of the retransmitted packet;

the error correcting circuit should preferably carry out the error correcting operation again with respect to the overall basic data that contains the retransmitted packet, with use of the error correcting code consisting of the basic data and the parity code, when the packet is found to still contain an error as a result of the repeat of the error correcting operation;

the second error detecting circuit should preferably carry out an error detecting operation again with respect to at least one packet of the basic data subjected to the repeat of error correction; and the transmission circuit should preferably request retransmission of at least one of the packets found to contain an error, from the sending side, if the Packets are found to contain errors as a result of the repeat of error detection. By virtue of this embodiment, the error correcting operation is again carried out with respect to the data corresponding to the packet. If the data is found to be free from error, neither the error correcting operation nor the retransmission request will be made, which in turn enables simplification of the processing. Further, it is possible to improve the throughput of the data receiving apparatus.

BRIEF DESCRIPTION OF THE DRAWINGS

FIGS. 2a to 2e are schematic representations showing the operation of the hybrid FEC/ARQ communications system shown in FIG. 1, wherein FIG. 2a shows basic data, FIG. 2b shows division of the basic data into data segments; FIG. 2c shows addition of an error detecting code to each data segment; FIG. 2d shown addition of a BCH-based parity code to each data segment complete with the error detecting code; and FIG. 2e shows creation of a data packet by addition of a packet header to each data segment complete with the error detecting code and the BCH-based parity code;

FIGS. 5a–5d are schematic representations showing the operation of the hybrid FEC/ARQ communications system of the first embodiment, wherein FIG. 5a shows basic transmission data, FIG. 5b shows division of the basic transmission data into data packets; FIG. 5c shows addition of an error detecting code to each data segment; and FIG. 5d shows creation of a data packet by addition of a packet header to each data segment complete with the error detecting code;

FIGS. 7a to 7d are schematic representations showing the operation of a data receiver of the first embodiment, wherein FIG. 7a shows a received data packet, FIG. 7b shows transmission basic data complete with a BCH-based parity code; FIG. 7c shows corrected basic data; and FIG. 7d shows detection of errors;

DESCRIPTION OF THE PREFERRED EMBODIMENTS

With reference to the accompanying drawings, preferred embodiments of the present invention will be described hereinbelow.

Figure 1:
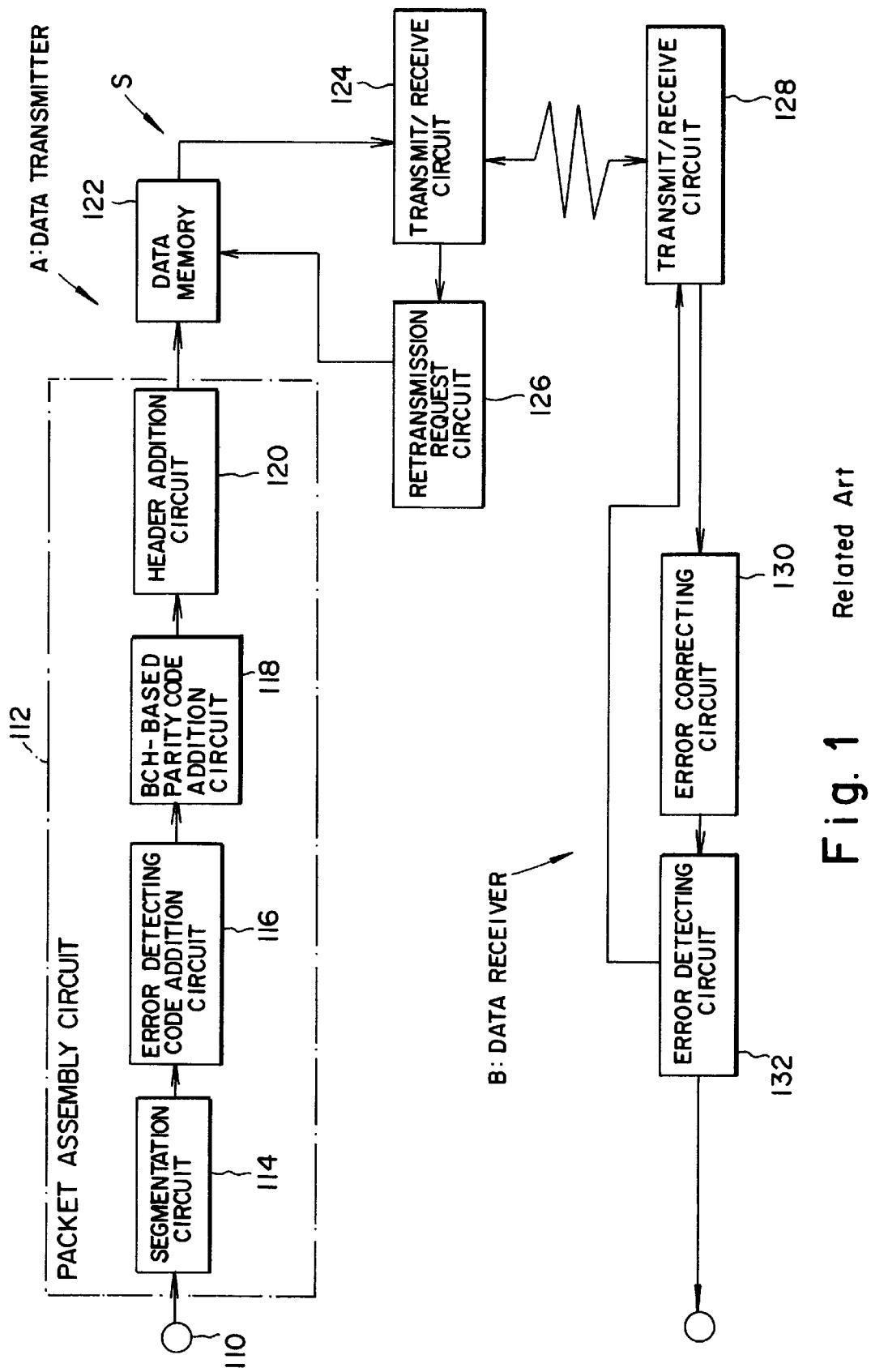
FIG. 1 is a block diagram showing the configuration of a conventional hybrid FEC/ARQ communications system.
Figure 2:
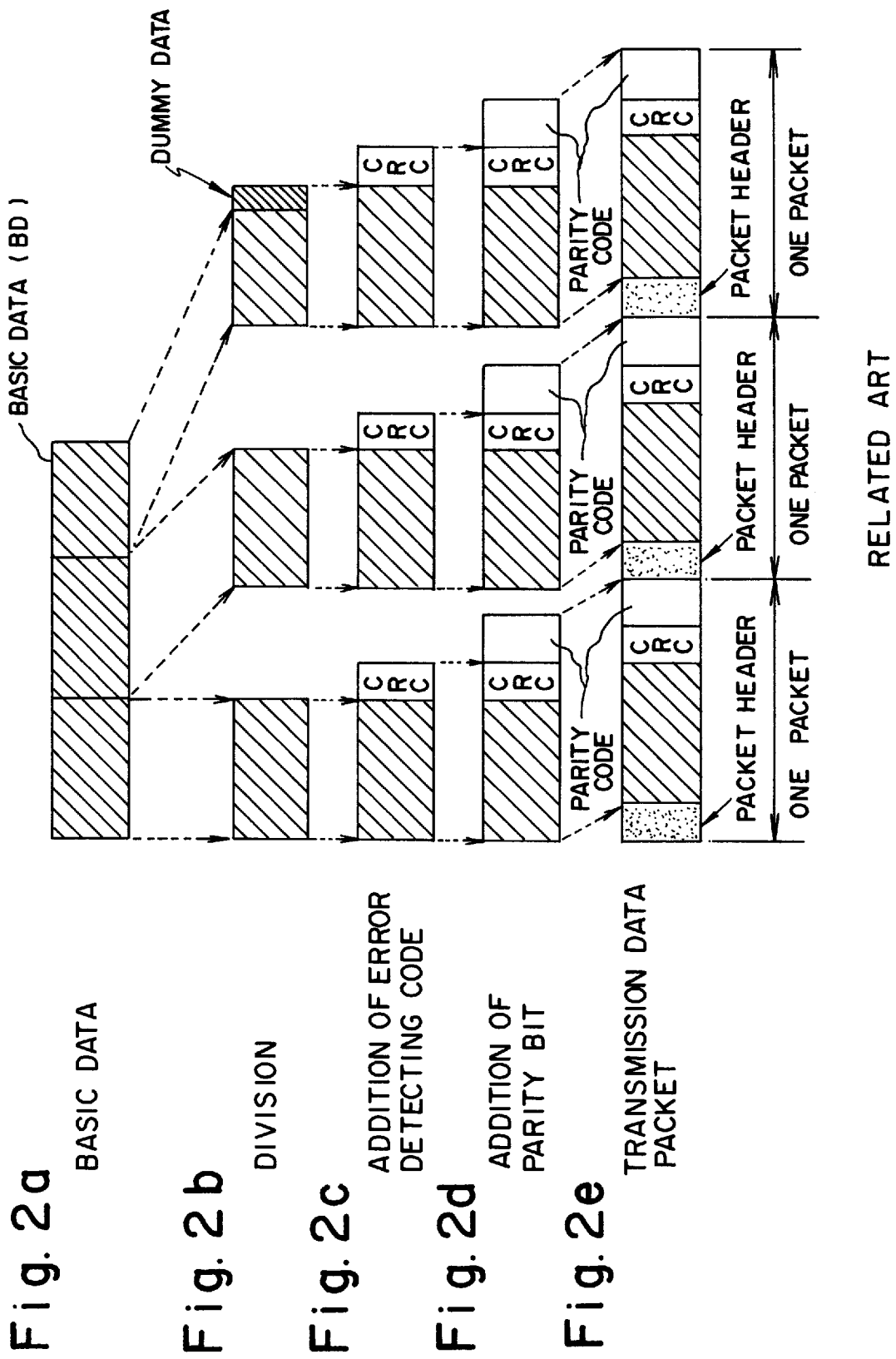
Figure 3:
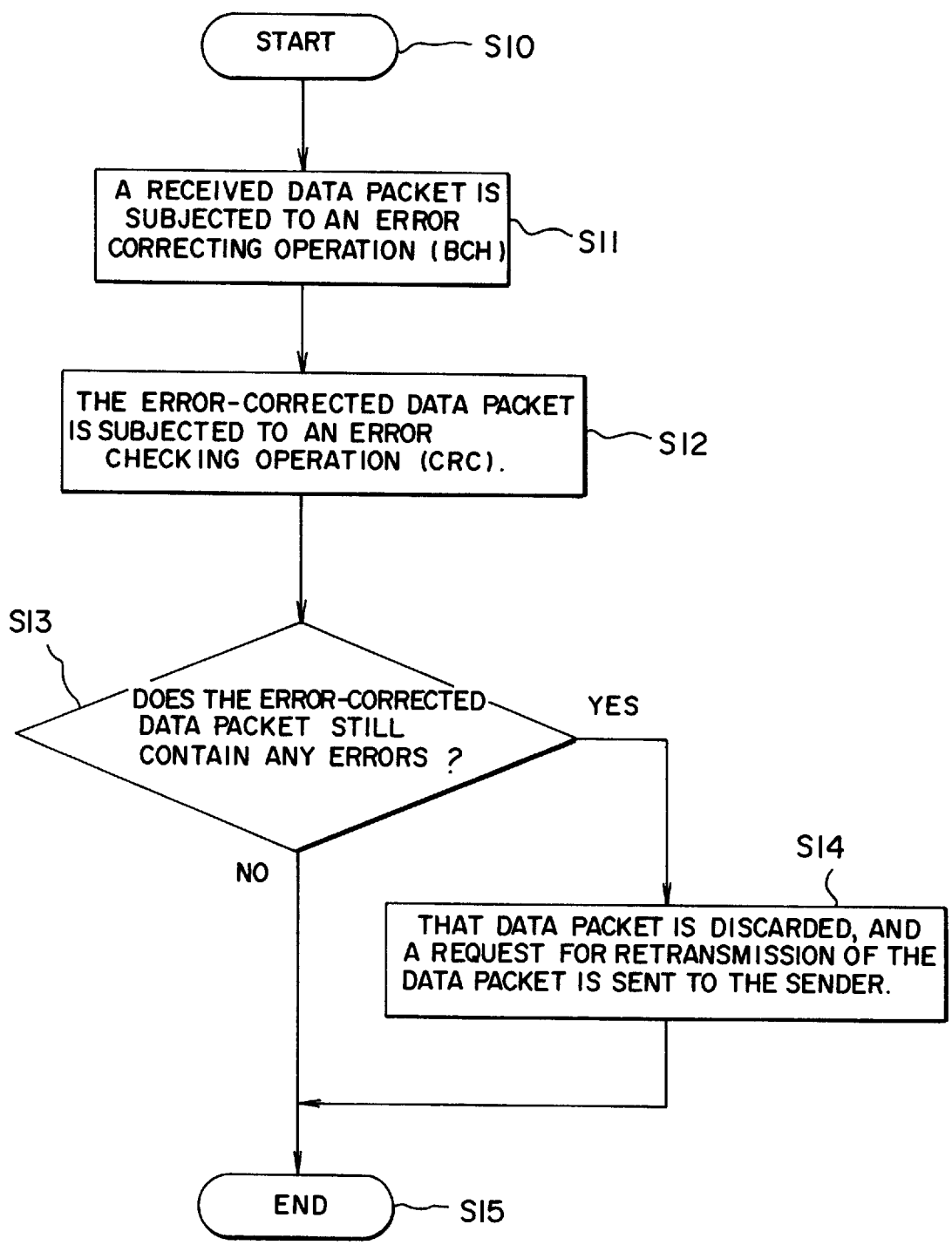
FIG. 3 is a flowchart showing the operation of a data receiver of the hybrid FEC/ARQ communications system shown in FIG. 1.
Figure 4:
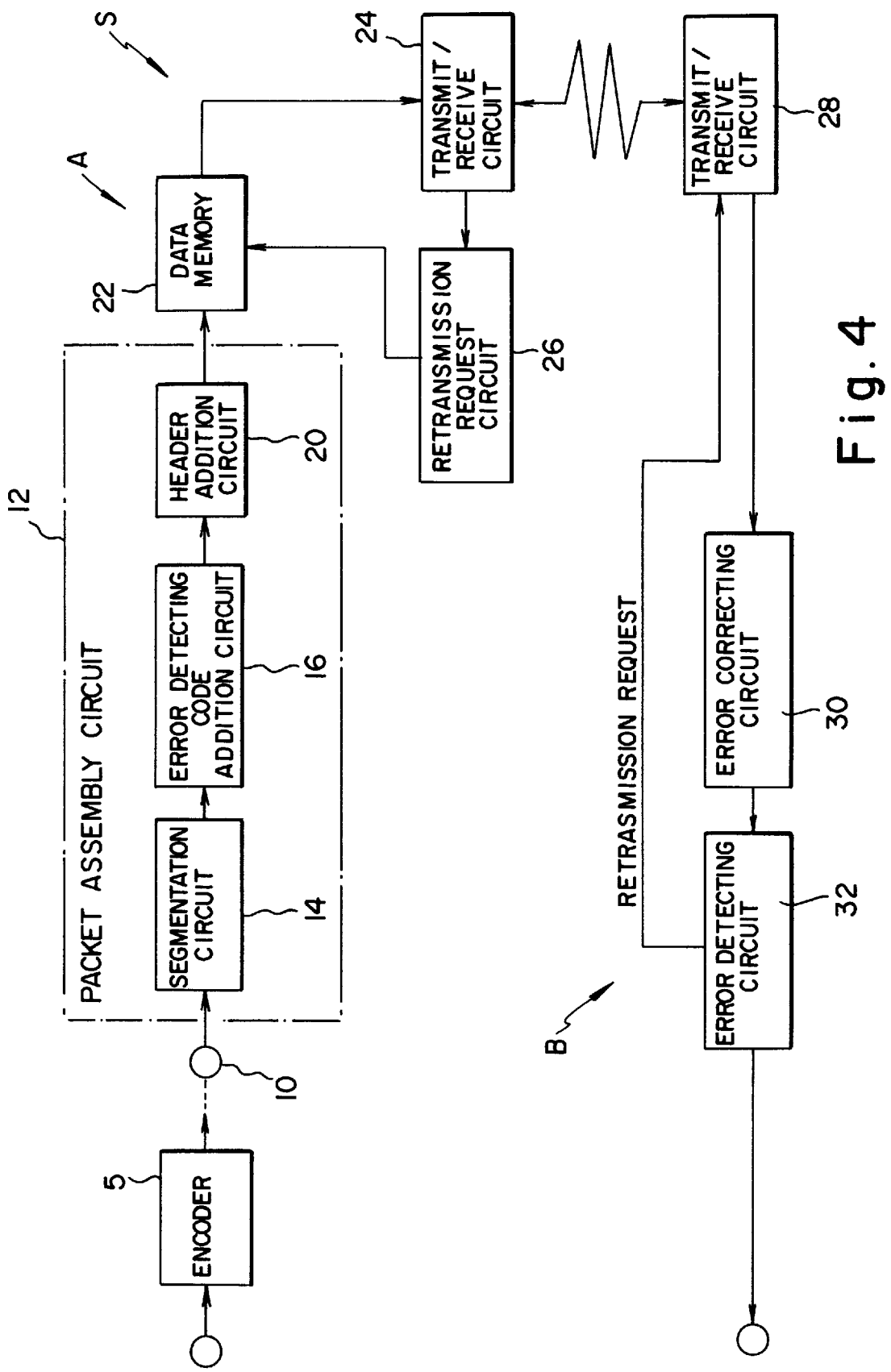
FIG. 4 is a block diagram showing the configuration of a hybrid FEC/ARQ communications system according to a first embodiment of the present invention.

To begin with a hybrid FEC/ARQ communications system S according to a first embodiment of the present invention will be described. The hybrid FEC/ARQ communications system S of the first embodiment has a data transmitter A and a data receiver B. The data transmitter A comprises an input terminal 10, a packet assembly circuit 12, data memory 22, a transmit/receive circuit 24, and a retransmission request circuit 26, as shown in FIG. 4. The packet assembly circuit 12 is comprised of a segmentation circuit 14, an error detecting code addition circuit 16, and a header addition circuit 20.

Figure 5:
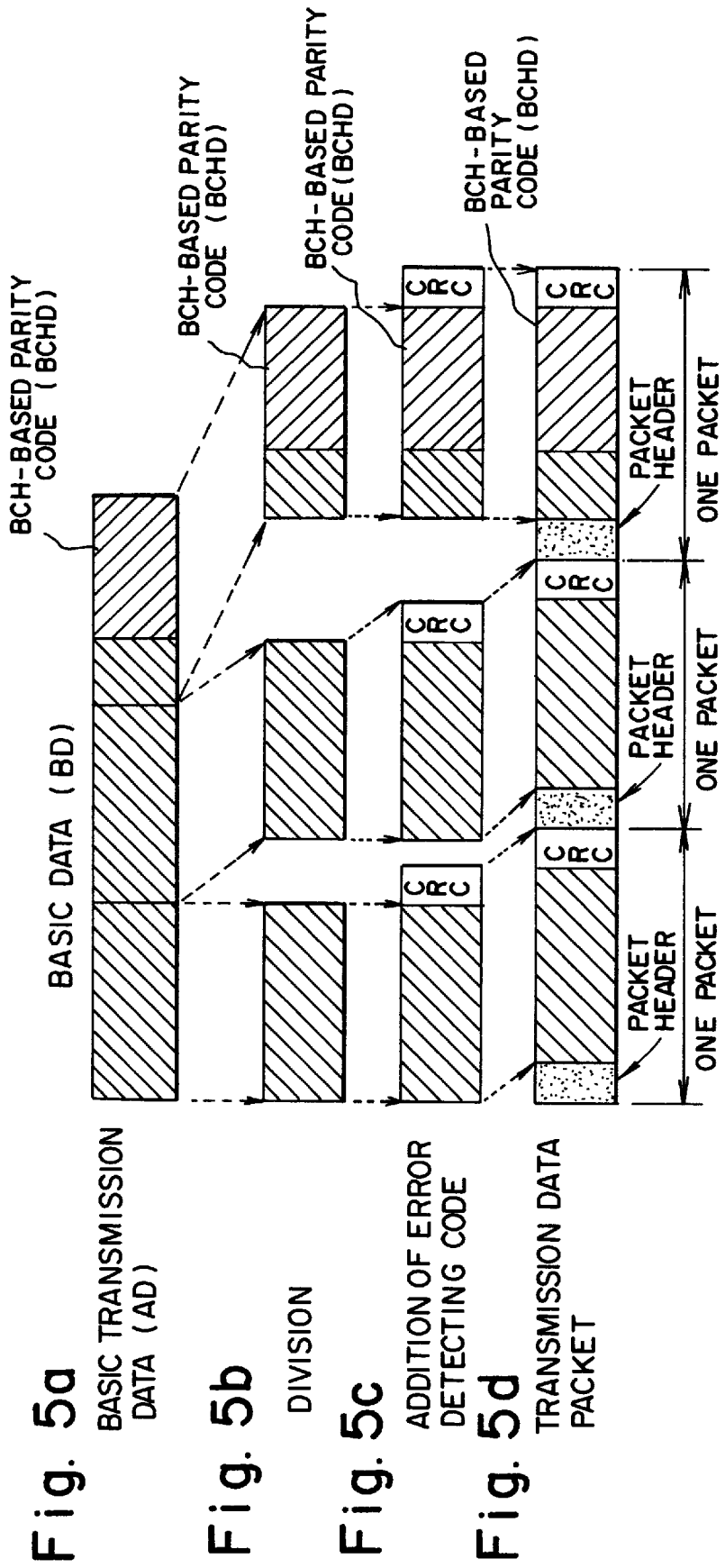

The input terminal 10 receives basic transmission data AD, as shown in FIG. 5A. The basic transmission data AD corresponds to a BCH code. More specifically, the basic transmission data AD is changed to the BCH code by appending a BCH-based parity code (BCHD), which acts as an error correcting parity code, to the basic data BD. An encoder 5 carries out the generation of the basic transmission data AD from the basic data BD.

The segmentation circuit 14 divides the basic transmission data AD into a fixed length, as shown in FIG. 5b. The error detecting code addition circuit 16 appends an error detecting code to the thus-divided data segments, as shown in FIG. 5c. A CRC code is herein used as the error detecting code. The header addition circuit 20 further appends a packet header to each data segment complete with the CRC code, whereby a transmission data packet is generated, as shown in FIG. 5d. As described above, the packet assembly circuit 12 appends the error correcting code for ARQ purposes to the basic transmission data AD having subjected to FEC.

The data memory 22 stores the transmission data packet generated by the packet assembly circuit 12. The data memory 22 maintains the transmission data packet after having sent it to the receiving side. This is because it is possible for the data memory 22 to quickly retransmit the transmission data packet if it receives a retransmission request from the receiving side.

The transmit/receive circuit 24 sends the transmission data packet stored in the data memory 22 to the data receiver B, as well as receiving a retransmission request from the data receiver B. Upon receipt of a retransmission request from the data receiver B via the transmit/receive circuit 24, the retransmission request circuit 26 causes the data packet that is the object of the retransmission request to be output to the transmit/receive circuit 24 from the data memory 22.

The data receiver B is provided with a transmit/receive circuit 28, an error correcting circuit 30, and an error detecting circuit 32, as shown in FIG. 4.

Figure 7:
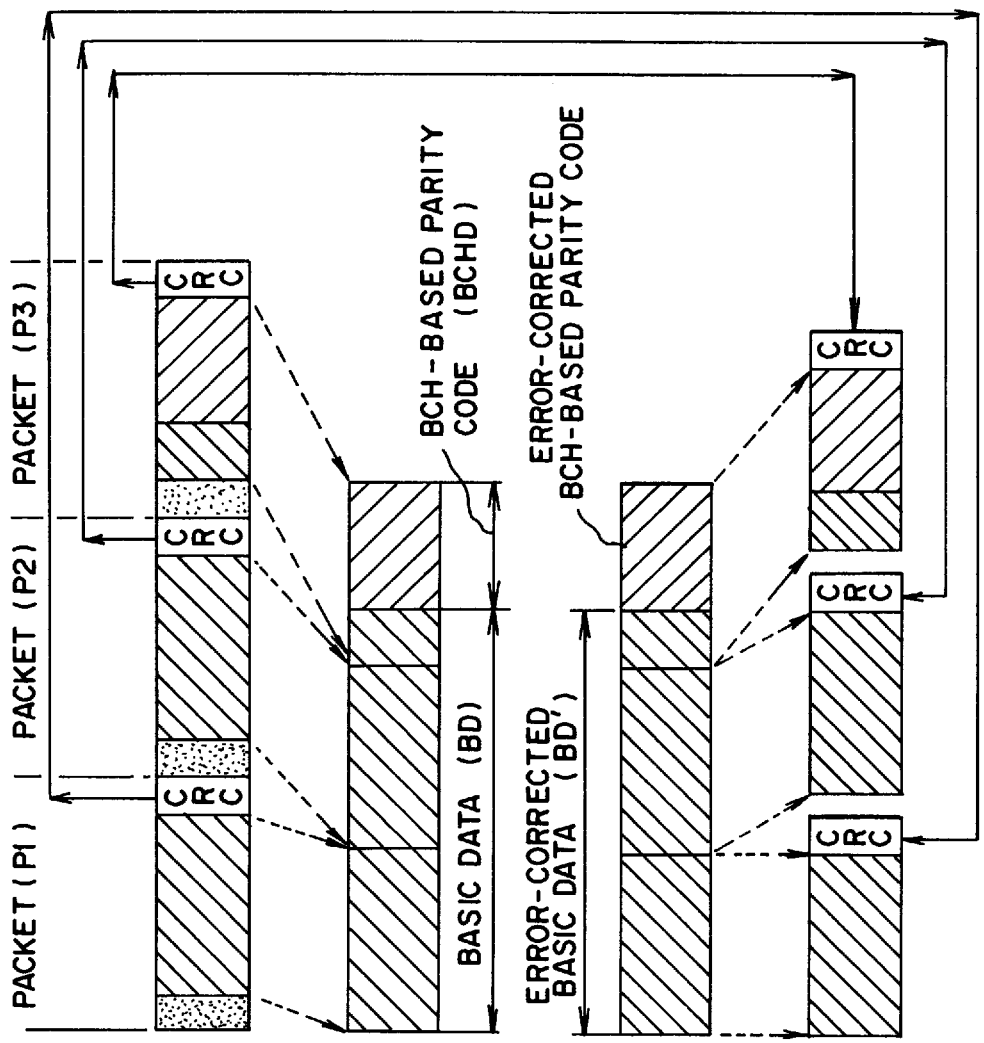

The transmit/receive circuit 28 receives data from the data transmitter A, as well as sending a retransmission request to the data transmitter A. The transmit/receive circuit 28 acts as a receiving circuit and a transmitting circuit. After having received all the basic transmission data AD divided into a plurality of data packets, the error correcting circuit 30 carries out an error correcting operation using the BCH code, as show in FIGS. 7a to 7c. There may be a case where errors arising in the packets can be corrected by the above-described error correcting operation. The error detecting circuit 32 detects errors in the data thus corrected by the error correcting circuit 30 using the CRC code, as shown in FIG. 7d. If errors are detected, a request for retransmission of the data packet found to contain errors will be sent to the data transmitter A via the transmit/receive circuit 28.

The operation of the previously described data transmitter A and the data receiver B will be briefly described.

The input terminal 10 of the data transmitter A receives the basic transmission data AD (see FIG. 5A), and the thus-received basic transmission data is sent to the packet assembly circuit 12. The basic transmission data AD has already been changed to a BCH code by addition of a BCH-based parity code to the basic data BD as a result of the FEC operation. The basic transmission data AD is divided into data segments by the segmentation circuit 14 of the packet assembly circuit 12 so that they can be assembled into packets, as shown in FIG. 5b. The error detecting code addition circuit 16 appends the CRC code to each data segment, as shown in FIG. 5c. The header addition circuit 20 appends a packet header to the data segment complete with the error detecting code, whereby a transmission data packet is assembled, as shown in FIG. 5d. The thus-assembled transmission data packet is stored in the data memory 22 and sent to the data receiver B via the transmit/receive circuit 24.

In the data receiver B, the following operations are carried out, as shown in FIG. 6 and FIGS. 7a to 7d. To begin with, the transmit/receive circuit 28 receives the transmission data packet. The thus-received transmission data packet has such a configuration as shown in FIG. 7a. After all of the transmission data packets including the BCH code have been received, the error correcting circuit 30 corrects errors in the basic data using the BCH code (in S21 and S22 in FIG. 6). In short, the error correcting circuit 30 derives the basic data BD and the BCH-based parity code BCHD which acts as an error correcting parity code, from the received data packet. Then, errors in the basic data are corrected using the BCH code, as shown in FIGS. 7b and 7c. The BCH code includes the basic data BD and the BCH-based parity code BCHD. More specifically, all the three data packets rather than each data packet, as a whole, are subjected to the error correcting operation. As a matter of course, the CRC codes of the received data packets are separately maintained. There may be a case where errors arising in transmission can be corrected by the error correcting operation.

Figure 6:
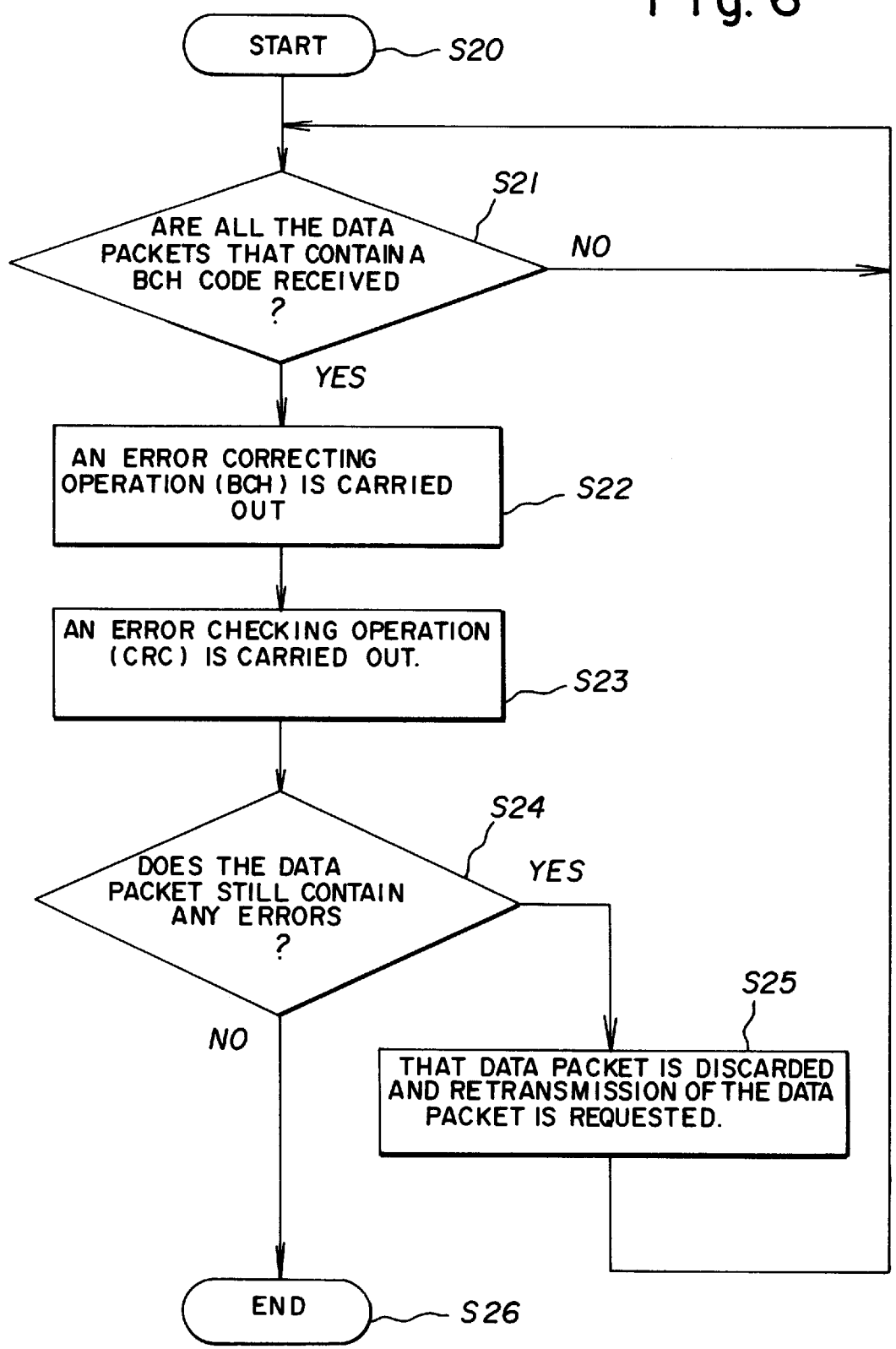
FIG. 6 is a flowchart for explaining the operation of the hybrid FEC/ARQ communications system of the first embodiment.

The error detecting circuit 32 carries out an error detecting operation with respect to the data packet using the CRC code (in S23 shown in FIG. 6). The error detecting circuit 32 again divides the thus-corrected basic data BD' into data segments so as to correspond to the packets, as shown in FIG. 7d. The thus-divided data segments are subjected to an error correcting operation using the CRC code. If one data segment is found to contain errors, this data segment will be discarded, and a request for retransmission of a data packet corresponding to that data segment will be sent to the transmit/receive circuit 28. The transmit/receive circuit 28 requests the data transmitter A to retransmit the data packet in accordance with the retransmission request (in S24 and S25 shown In FIG. 6). If the data segments are found to be free from error, the processing will be terminated, If the plurality of data segments are found to contain errors as a result of the error correcting operation based on the CRC coder a request for retransmission of a data packet corresponding to one of the data segments will be issued.

If the request for retransmission of a data packet is issued, the processing will return to step S21, and the previously-described operations will be carried out. Specifically, the basic transmission data having the data segment replaced with a retransmitted data packet, as a whole, is subjected to the error correcting operation again (S22). Then, the basic transmission data is subjected to the error detecting operation (S23). More specifically, if a request for retransmission of the data packet P1 is issued, and the data packet P1 is retransmitted during the operations shown in FIGS. 7a through 7d, the basic data segment of the data packet P1 will be replaced with that of the retransmitted data packet. Subsequently, the basic data is again subjected to the error correcting operation using the BCH code. Then, the data portion of the data packet P1 is subjected to the error detecting operation. If the data portion of the data packet P1 is found to be free from error, the data portion of the data packet P2 will be subjected to the error detecting operations. The same operations will be carried out for the other data packets. If the data portion of the data packet P1 is still found to contain errors, a request for retransmission of the data portion of the data packet P1 will be issued again. In contrast, if the data portion of the data packet P1 is Found to be free from error as a result of the first error detecting operation, the data portion of the data packet P2 will be subjected to the error detecting operation. If the data portion of the data packet P2 is found to contain errors, a request for retransmission of the data portion of the data packet P2 will be issued. If all of the data packets are found to be free from error, the processing will be terminated.

As described above, the hybrid FEC/ARQ communications system of the present embodiment can properly carry out the hybrid FEC/ARQ mode even when FEC is not carried out on a packet-by-packet basis. Further, if a retransmission request is issued, retransmission of a data packet for one data segment will be initially required. The basic transmission data including that data segment, as a whole, is subjected to an error correcting operation. If no errors are detected as a result of the following error detecting operation, the processing will be terminated. As a result, the throughput of the hybrid FEC/ARQ communications system can be improved.

It is also possible to subject only one data segment to the error detecting operation, and a request for retransmission of a data packet corresponding to the data segment may be issued at the time when that data segment is found to contain errors.

A hybrid FEC/ARQ communications system according to a second embodiment of the present invention will now be described. The second embodiment is substantially the same as the first embodiment, but it differs from the first embodiment in that a retransmission-free operation which requires only error detection is carried out.

Figure 8:
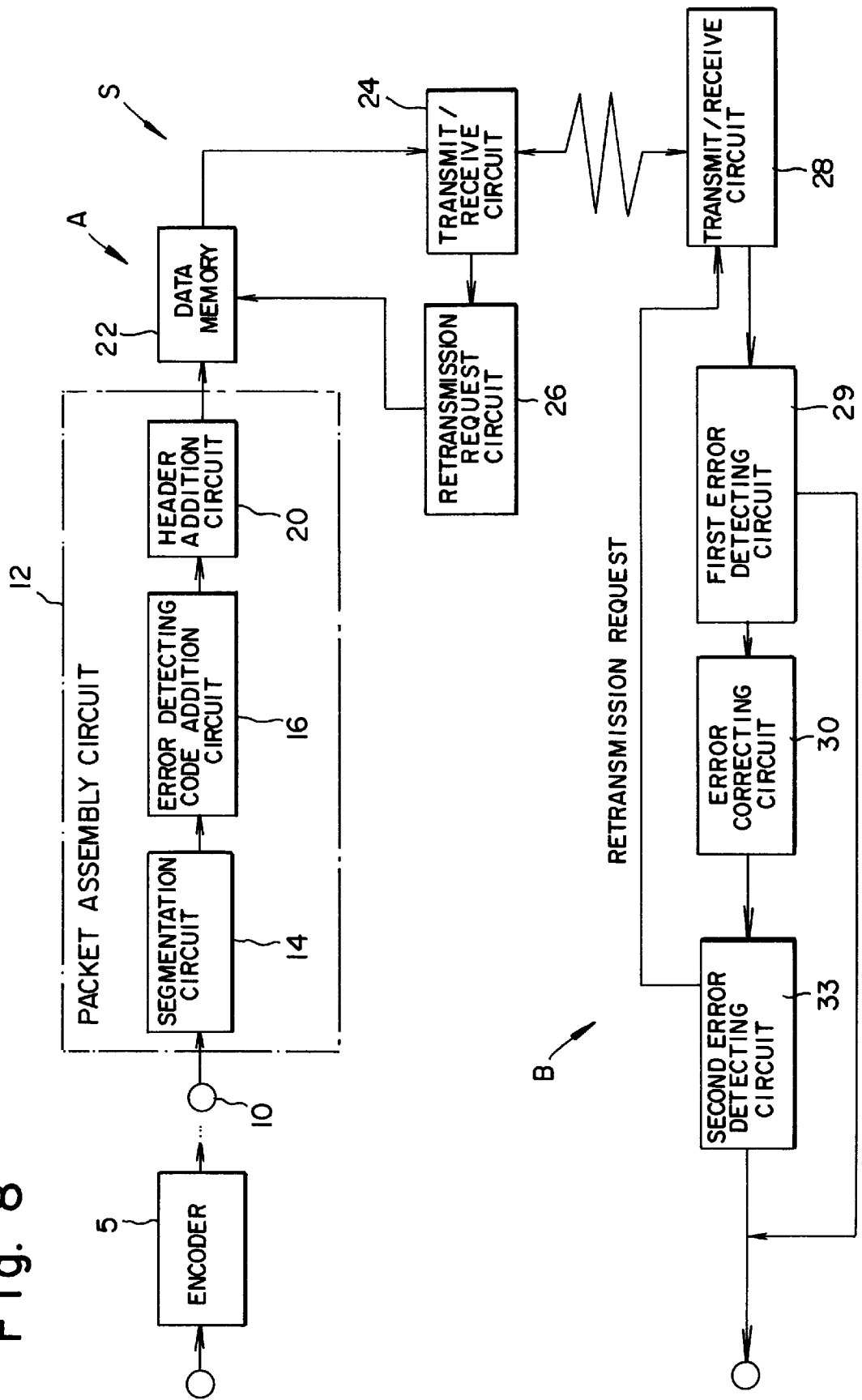
FIG. 8 is a block diagram showing the configuration of a hybrid FEC/ARQ communications system according to a second embodiment of the present invention.

The hybrid FEC/ARQ communications system S of the second embodiment has a data transmitter A and a data receiver B. The data transmitter A comprises an input terminal 10, a packet assembly circuit 12, data memory 22, a transmit/receive circuit 24, and a retransmission request circuit 26, as shown in FIG. 8. The packet assembly circuit 12 is comprised of a segmentation circuit 14, an error detecting code addition circuit 16, and a header addition circuit 20. The data transmitter A has the same configuration as that of the data transmitter A of the first embodiment, and therefore its explanation will be omitted here. Even in the second embodiment, the encoder 5 generates the basic transmission data AD which serves as the error correcting code.

The data receiver B is provided with a transmit/receive circuit 28, a first error detecting circuit 29, an error correcting circuit 30, and a second error detecting circuit 33, as shown in FIG. 8. The transmit/receive circuit 28 acts as a receiving circuit and a transmitting circuit.

As in the case of the first embodiments the transmit/receive circuit 28 receives data from the data transmitter A, as well as sending a retransmission request to the data transmitter A. The first error detecting circuit 29 carries out an error detecting operation with respect to each of the data Packets received by the transmit/receive circuit 28 using the CRC code. If a sequence of data packets are found to contain errors by the first error detecting circuit 29, the error correcting circuit 30 will carry out an error correcting operation using the BCH code, as shown in FIGS. 7b and 7c. There may be a case where errors arising in the data packet can be corrected as a result of the error correcting operation. The second error correcting circuit 33 detects errors in the basic data corrected by the correcting circuit 30 using the CRC code, as shown in FIG. 7d. If one data packet is found to contain errors, a request for retransmission of that data packet found to contain errors is sent to the data transmitter A via the transmit/receive circuit 28.

The operation of the data transmitter A and the data receiver B will be described.

The data transmitter A operates in the same manner as does the data transmitter A of the first embodiment. In short, the input terminal 10 of the data transmitter A receives basic transmission data AD (see FIG. 5A), and the thus-received basic transmission data AD is sent to the packet assembly circuit 12. The packet assembly circuit 12 divides the basic transmission data AD into data segments, and each data segment is provided with a CRC code. The data segment complete with the CRC code is further Provided with a packet header, thereby a transmission data packet is generated. The transmission data packet is stored in the data memory 22, and the thus-stored transmission data packet is then sent to the data receiver B by means of the transmit/receive circuit 24.

The data receiver B performs the following operations, as shown in FIGS. 7a to 7d and FIG. 9. Specifically, the transmit/receive circuit 28 receives the transmission data packet. The thus-received transmission data packets are arranged in such a configuration as shown in FIG. 7a. If all the transmission data packets containing a BCH code are received, the first error detecting circuit 29 carries out an error detecting operation with respect to each of the received data packets using the CRC code (in S31 and S32 shown in FIG. 9). For instance, the data portions of data packets P1, P2, and P3 are subjected to an error detecting operation using the respective CRC codes appended thereto.

Figure 9:
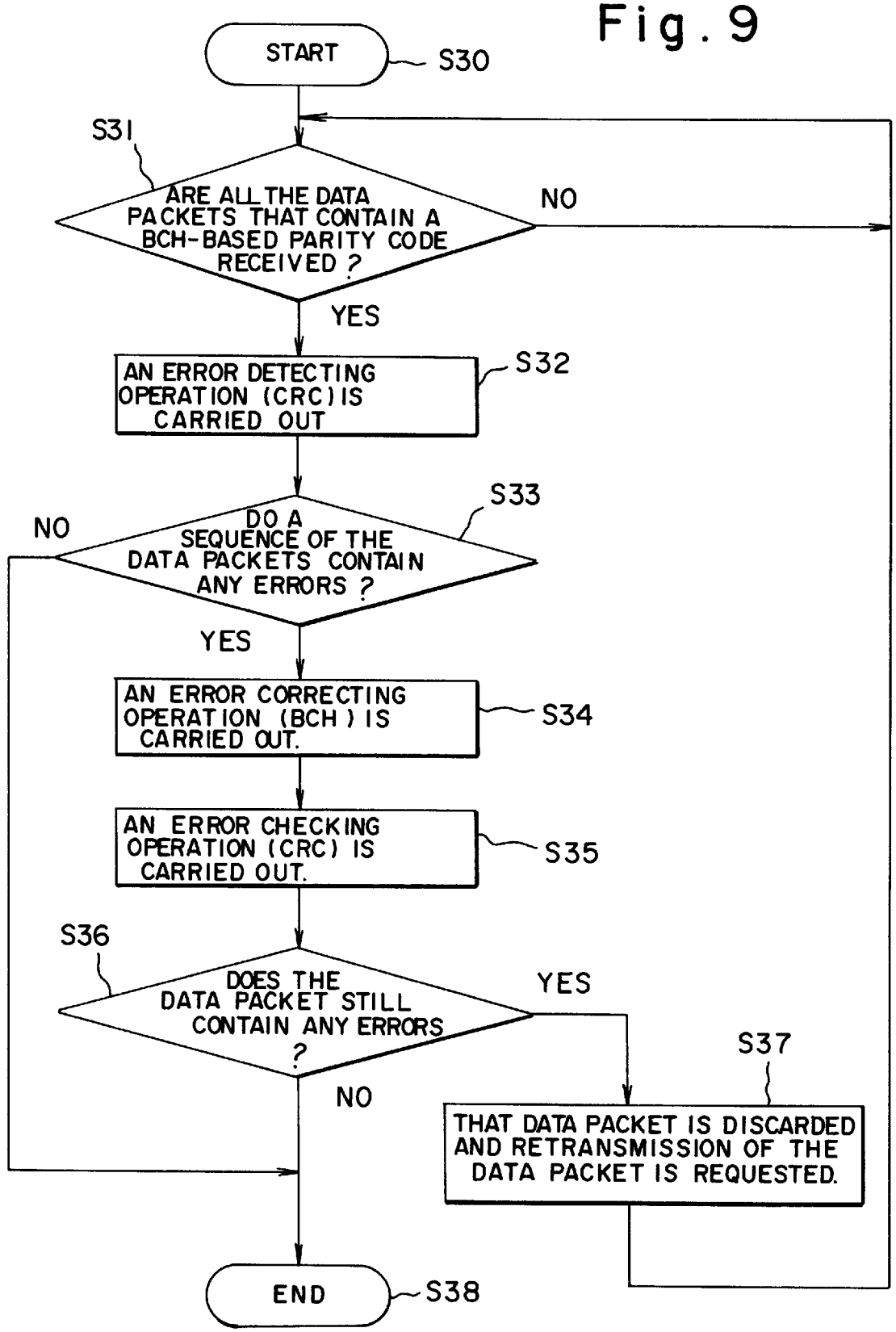
FIG. 9 is a flowchart for explaining the operation of the hybrid FEC/ARQ communications system of the second embodiment.

If the sequence of these data packets are found to be free from error as a result of the error detecting operation, the processing will be terminated (in S33 and S38 shown in FIG. 9). In contrast, if even one data packet is found to contain errors, the processing will proceed to step S34, and the operations that are the same as those following step S22 will be carried out. In other words, the correcting circuit 30 carries out an error correcting operation using the BCH code (in S34 shown in FIG. 9). There may be a case where errors arising in transmission can be corrected as a result of the correcting operation. Subsequently, the error detecting circuit 32 detects errors in the data segments using the CRC code (in S35 shown in FIG. 9). If the data segment is found to contain errors, this data segment will be discarded, and a request for retransmission of a packet data corresponding to this data segment will be sent to the transmit/receive circuit 28. A request for retransmission of the data packet corresponding to this data segment is sent to the data transmitter A in accordance with the retransmission request (in S36 and S37 shown in FIG. 9). If the data segments are found to be free from error, the processing will be terminated. However, if the plurality of data segments are found to contain errors, retransmission of a data packet corresponding to any one of the data segments will be requested. Further, if one data segment is found to contain an error, the processing may proceed to step S34.

If the data packet is retransmitted, the processing will return to step S31, and the operations following step 31 will be carried out. In short, the sequence of the data packets that include the basic data portion of the retransmitted data packet are subjected to an error detecting operation. If no errors are detected, the processing will be terminated (in S32 and S33). In contrast, if any errors are detected, the basic transmission data will be subjected to an error correcting operation. In other words, the basic transmission data having the data packet replaced with the retransmitted data packet is again subjected to the error correcting operation (S34) and is, then, subjected to the error detecting operation (S35). More specifically, if the data packet P1 is retransmitted, the data portions of the sequence of the data packets P1 to P3 will be corrected to the error detecting operation, as shown in FIGS. 7a to 7d. If no errors are detected, the processing will be terminated. In contrast, if any errors are detected, the basic transmission data that includes the data packet P1 having its data portion replaced with the data portion of the retransmitted data packet, will be subjected to the error correcting operation again using the BCH code. If the data packet P1 is found to be free from error as a result of the error checking operation, the data Packet P2 will be subjected to the error detecting operation. Similarly, the same operations will be carried out with respect to the remaining data packets. Even in this case, if the data portion of the data packet P1 is found to contain errors, retransmission of the data packet P1 will be requested again. In contrast, if the data packet P1 is not found to contain errors as a result of the first error detecting operation, the data packet P2 will be subjected to the error detecting operation. If the data packet P2 is found to contain errors, retransmission of the data packet P2 will be requested. If all the data packets are found to be free from error, the processing will be terminated.

As described above, the hybrid FEC/ARQ communications system of the second embodiment is capable of properly realizing a hybrid FEC/ARQ mode even when FEC is not carried out on a packet-by-packet basis. If a retransmission request is issued, retransmission of a data packet for one data segment will be initially required. The basic transmission data including that data segment, as a whole, is subjected to an error correcting operation. If no errors are detected as a result of the following error detecting operation, the processing will be terminated. As a result, the throughput of the hybrid FEC/ARQ communications system can be improved.

Particularly, when the transmission data packet is received, each data packet is initially subjected to the error correcting operation in the second embodiment. If the data packets are found to be free from error, neither the error correcting operation nor a retransmission request will be carried out, which enables simplification of the processing.

Although it has been described in the first and second embodiments that one data packet is subjected to the error correcting operation and is requested for retransmission, a plurality of data packets may be subjected to the error correcting operations and requested for retransmission.

Next, a third embodiment of the present invention will be described. The third embodiment is directed to transmission of a video signal over a PHS.

As is publicly known, a PHS (Personal Handy Phone System) has already been used as a portable telephone system in Japan. This PHS adopts a TDMA/TDD (Time Division Multiplex Access/Time Division Duplex) method and is capable of transmitting 32 Kbs of information per second through one slot. If an increased number of slots are used, it will become possible to transmit a much greater amount of information. In the case where a video signal is transmitted by utilization of two slots of the PHS, video data of a low bit rate will be preferable.

In contrast, ITU-T (International Telecommunication Union-Telecommunication Standardization Sector) has already standardized H.261 (p '64 Kbs/s) as a compression scheme for a moving picture of a low bit rate.

In the third embodiment, H.261 video information is transmitted at a rate of 64 Kbs/s by use of two slots of the PHS. An error correcting code (BCH code) which has already been adopted for H.261 is used in FEC (i.e., in an error correcting operation). Further, an error detecting code appended to each slot of the PHS is utilized as the error detecting code for ARQ (Automatic Repeat Request) purposes.

Figure 10:
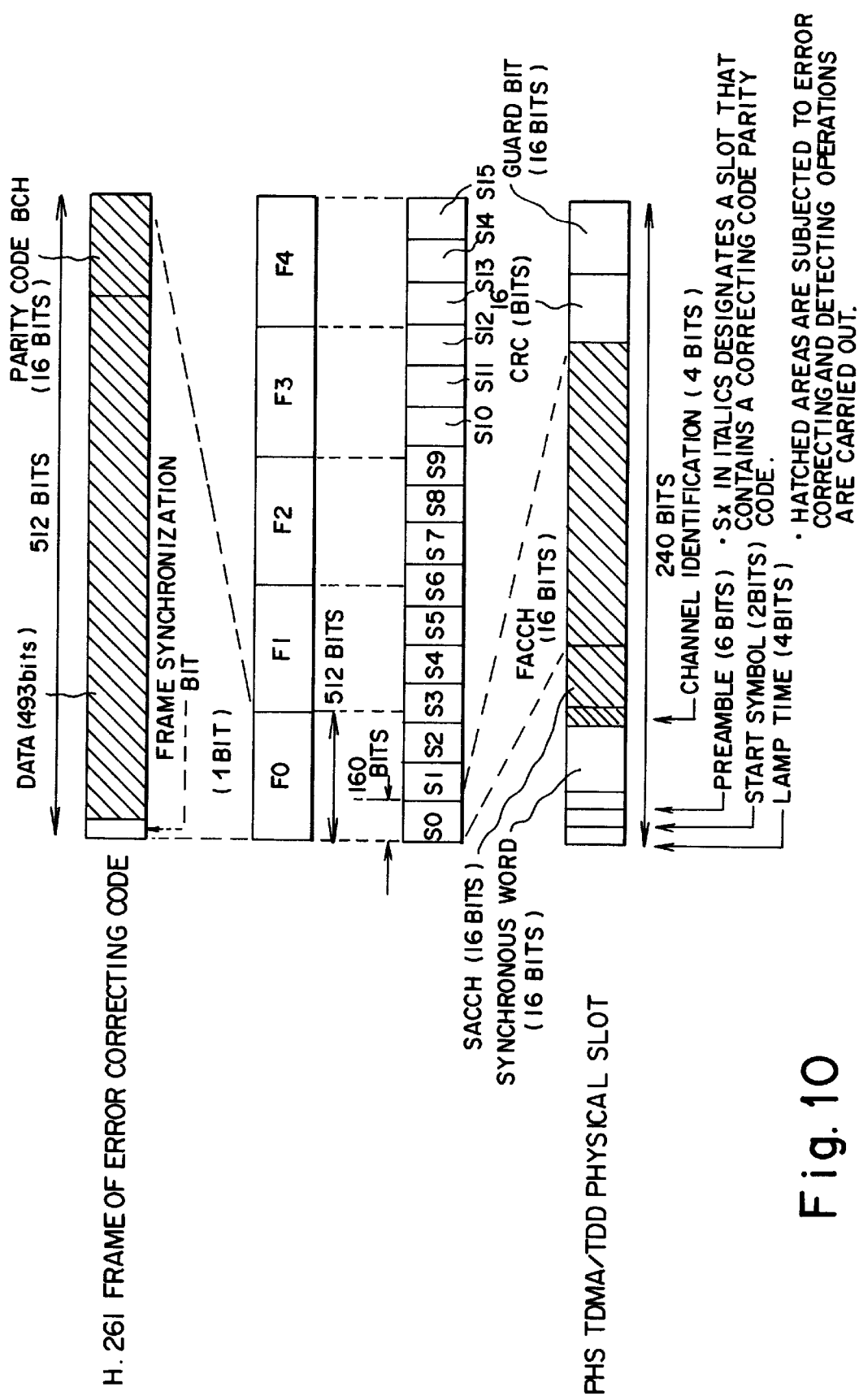
FIG. 10 is a schematic representation showing the operation of a hybrid FEC/ARQ communications system according to a third embodiment of the present invention.

FIG. 10 shows the relationship between the configuration of slots of the PHS and the configuration of an FEC frame according to H.261.

To begin with, the configuration of PUS data will be described. As previously described, the PHS adopts the TDMA/TDD method. One frame having a period of 5 msec is time-divided into eight slots. The former four slots are used as slots for communication from a base station to a terminal, whereas the latter four slots are used as slots for communication from the terminal to the base station. The terminal establishes bidirectional communication by use of a corresponding pair of slots or a plurality of slot pairs. Each slot including 240 bits is provided with an FACCH (Fast Attendant Control Channel: 160 bits) and an SACCH (Slow Attendant Control Channel: 16 bits) as data transmission channels.

Video transmission is carried out by utilization of the above-described FACCH and SACCH, etc., in the third embodiment. More specifically, video information is transmitted over the FACCH, whereas control information such as ACK/NACK or a slot number is transmitted over a channel corresponding to the SACCH. Further, each slot is provided with 16 bits of CRC (Cyclic Redundancy Check) code (a generating function of this code is $1+X^5+X^{12}+X^{16}$). By means of the CRC code, it is possible to carry out an error detecting operation with respect to a channel discriminator, the SAC, and the FACCH.

The configuration of H.261 data will now be described.

H.261 handles 512 bits of FEC frame as a transmission unit, as shown in FIG. 10. The FEC frame is provided with a frame synchronization bit (i.e., a synchronizing signal) followed by encoded and compressed video information (493 bits of data payload). Further, H.261 employs a BCH (511,493) error correcting code (a generating function of this code is $(1+X^9+X^9)(1+X^3+X^4+X^6+X^9)$). BCH-based parity code of 18 bits is appended to the video information. In short, the substantial data length of the FEC frame, with the exception of synchronous bits, etc., is 511 bits. The data length of the FEC frame before the BCH-based parity code is appended to the FEC frame is 493 bits. By means of the BCH code, it Is possible to correct random errors up to two bits or burst errors up to six bits.

In the case where the video information encoded and compressed according to H.261 is transmitted in compliance with the PHS transmission standards, it is possible to transmit exactly five FEC frames by use of 16 slots, as is evident from FIG. 10. In this case, it is possible to specify the slots that contain the BCH-based parity code; namely, slots S3, S6, S9, S12, and S15 shown in FIG. 10. Since the BCH-based parity code is appended to the end portion of the H.261 FEC frame, the BCH-based parity code is contained in the end portion of a set of slots corresponding to each FEC frame.

Next, transmission of the video information, which is encoded and compressed according to H.261, in compliance with the PHS transmission standards will be described. As in the case of the first and second embodiments, a data transmitter and a data receivers are provided in the third embodiment. A video information transmission section of the data transmitter is provided with a transmission circuit, and an H.261 encoding section, whereas the data receiver is provided with a receiving circuit, a first error detecting circuit, an error correcting circuit, and a second error detecting circuit.

The H.261 encoding section of the data transmitter encodes a video signal. The transmission circuit transmits a slot number (0–15) and video information using two slots within the identical frame. In short, data in FEC frame F0 is transmitted every 160 bits over the two time slots S0 and S1. The slot number (0 to 15) designates the relationship between the FEC frame and the slots. Even in the next frame, the remaining data of the FEC frame F0 and some of the data of FEC frame F1 are transmitted over two slots S2 and S3.

The receiving circuit of the data receiver sequentially receives the data sent over the two slots within the identical frame. The following processing will be carried out at the time when it is decided from the slot number that receipt of the data of one frame has been completed.

Specifically, the first error detecting circuit detects errors in the data received over each slot using the CRC code. If any errors are detected as a result of this error detecting operation, the error correcting circuit will carry out an error correcting operation with respect to the FEC frame. In contrast, if the data is found to be free from error, the processing will be terminated.

The second error detecting circuit carries out an error detecting operation on a slot-by-slot basis with respect to the error-corrected FEC frame using the CRC code. If the FEC frame is found to be free from error, ACK (Acknowledge) containing the slot numbers acknowledged to have been received will be returned. The ACK designates proper receiving conditions. If the FEC frame is found to contain errors, NACK (Negative Acknowledgement) containing the slot number found to contain errors will be returned. This NACK signifies a retransmission request. With regard to the retransmission request, it is possible to make a request for the retransmission of one of the slots found to contain errors or for the retransmission of more than two slots.

The data transmitter at the receiving side that received NACK carries out a retransmission operation according to the following procedures:

(1) Where retransmission of only one data slot is requested, the same information will be retransmitted while superimposed on the next two data slots. In other words, the same data is retransmitted while superimposed on each of the two data slots. The data having superior quality of the two data items is selected by the receiving side.

(2) Where retransmission of two data slots is requested, they will be retransmitted by use of the next two data slots.

(3) Where retransmission of more than three data slots is requested, the first two data slots will be retransmitted by use of two data slots of the next one frame (i.e., eight data slots) as in the case of (2). Processing similar to the processing described in (1), (2), and (3) is carried out depending on the number of data slots which have not been retransmitted yet.

If the data slot found to contain errors has been retransmitted, the data receiver will detect errors in a sequence of data slots that include the retransmitted data slot. If the sequence of data slots are found to be free from errors, the processing will be terminated. In contrast, if the sequence of data slots are found to contain errors, the FEC frame will be subjected to the error correcting operation. In other words, the FEC frame having the data slot replaced with the retransmitted data slot is again subjected to the error correcting operation. Next, each data slot is subjected to the error detecting operation, which is followed by the previously described processing. Specifically, if each data slot is found to be free from error, ACK containing the slot numbers acknowledged to have been received will be returned. In contrast, if the data slot is found to contain errors, NACK containing the slot number found to contain errors will be returned. The data transmitter at the receiving side that received NACK performs the same operations as previously described.

Although the third embodiment has been described with reference to H.261 as the moving picture compression method for a low bit rate, the present patent may be practiced in compliance with MPEG 4 (Moving Picture Experts Group).

Data that is pursuant to H.261 image compression standards is transmitted in compliance with the PHS transmission system standards by utilization of ARQ. For this reason, large transmission delays will arise as a result of the retransmission of data due to ARQ. In such a case, it is better for the receiving side to forcibly discard the delayed data so as to ensure synchronization.

More specifically, provided that delays arise in the transmission of data on several video frames before the transmission of a certain video frame is completed, synchronization is ensured by forcibly discarding the video frames other than the most current video frame. Consequently, the video information becomes jumbled. To prevent a decoded video image from being distorted as a result of the forcible discarding of the video frames, the H.261 encoder in the data transmitter carries out an intraframe encoding operation with respect to the most current video image output after the discarding of video frames.

Although the BCH code and the CRC code are used respectively as the error correcting code and the error detecting code in the previously described embodiments, it goes without saying that another error correcting code and another error detecting code may be used in place of them.

Several embodiments have now been described in detail. It is to be noted, however, that these descriptions of specific embodiments are merely illustrative of the principles underlying the inventive concept. It is contemplated that various modifications of the disclosed embodiments, as well as other embodiments of the invention, will, without departing from the spirit and scope of the invention, be apparent to those who are versed in the art.

What is claimed is:

1. A digital transmission method for sending a digital signal, comprising:
   a division step of dividing an error correcting code which includes basic data and a parity code, into smaller data segments;
   an error detecting code addition step of appending an error detecting code to each of the data segments divided in the division step;
   a transmission step of sending the data segments complete with the error detecting code on a packet-by-packet basis; and
   a retransmission step of retransmitting a requested data packet in response to a retransmission request of the data packet from a receiving side.

2. The digital transmission method as defined in claim 1, wherein the error correcting code is a BCH code.

3. The digital transmission method as defined in claim 1, wherein the error detecting code is a CRC code.

4. The digital transmission method as defined in claim 1, wherein the basic data is a video signal, and the basic data is transmitted in accordance with a TDMA/TDD method in the transmission step.

5. A digital receiving method for receiving a digital signal, comprising:
  a receiving step of receiving transmission data that comprises smaller packets, each having an error detecting code, into which an error correcting code consisting of basic data and a parity code appended thereto is divided:
  an error correcting step of carrying out an error correcting operation with respect to the overall received basic data using the error correcting code;
  an error detecting step of carrying out an error detecting operation with respect to at least one packet of the error-corrected basic data; and
  a request step of requesting retransmission of at least one of the packets found to contain an error, from the sending side.

6. A digital receiving method for receiving a digital signal, comprising:
  a receiving step of receiving transmission data that comprises smaller packets, each having an error detecting code, into which an error correcting code including basic data and a parity code appended thereto is divided;
  a first error detecting step of carrying out an error detecting operation with respect to at least one packet of the received basic data;
  an error correcting step of carrying out an error correcting operation with respect to the overall basic data using an error correcting code when the packet is found to contain an error in the first error detecting step;
  a second error detecting stop of carrying out an error detecting operation with respect to at least one packet of the error-corrected basic data; and
  a request step of requesting retransmission of at least one of the Packets found to contain an error, from the sending side.

7. A digital communications method for sending a digital signal, comprising:
  at the sending end,
  a division step of dividing an error correcting code which includes basic data and a parity code, into smaller data segments;
  an error detecting code addition stop of appending an error detecting code to each of the data segments divided in the division step;
  a transmission step of sending the data segments complete with the error detecting code on a packet-by-packet basis;
  a retransmission step of retransmitting a requested data packet in response to a retransmission request of the data packet from a receiving side;
  at the receiving end,
  a receiving step of receiving the transmission data sent in the transmission step;
  an error correcting step of carrying out an error correcting operation with respect to the overall received basic data using the error correcting code:
  an error detecting step of carrying out an error detecting operation with respect to at least one packet of the error-corrected basic data; and
  a request step of requesting retransmission of at least one of the packets found to contain an error, from the sending side.

8. The digital communications method as defined in claim 7, further comprising a step of carrying out the error correcting operation again with respect to the overall data that includes the basic data portion of a retransmitted packet, with use of the error correcting code consisting of the basic data and the parity code, when the packet for which the retransmission request was made is retransmitted from the sending side.

9. The digital communications method as defined in claim 7, wherein the error correcting code is a BCH code.

10. The digital communications method as defined in claim 7, wherein the error detecting code is a CRC code.

11. The digital communications method as defined in claim 7, wherein the basic data is a video signal, and the basic data is transmitted in accordance with a TDMA/TDD method in the transmission step.

12. The digital communications method as defined in claim 8, wherein the error correcting code is a BCH code.

13. The digital communications method as defined in claim 8, wherein the error detecting code is a CRC code.

14. The digital communications method as defined in claim 8, wherein the basic data is a video signal, and the basic data is transmitted in accordance with a TDMA/TDD method in the transmission step.

15. A digital communications method, comprising:
  at the sending end,
  a division step of dividing an error correcting code which includes basic data and a parity code, into smaller data segments;
  an error detecting code addition step of appending an error detecting code to each of the data segments divided in the division step;
  a transmission step of sending the data segments complete with the error detecting code on a packet-by-packet basis;
  a retransmission step of retransmitting a requested data packet in response to a retransmission request of the data packet from a receiving side; and
  at the receiving end,
  a receiving step of receiving the data transmitted in the transmission step;
  a first error detecting step of carrying out an error detecting operation with respect to at least one packet of the received basic data;
  a first error correcting step of carrying out an error correcting operation with respect to the overall basic data using an error correcting code when the packet is found to contain an error in the first error detecting step;
  a second error detecting step of carrying out an error detecting operation with respect to at least one packet of the error-corrected basic data; and
  a request step of requesting retransmission of at least one of the packets found to contain an error, from the sending side.

16. The digital communications method as defined in claim 15, further comprising:

a repeat of the first error detecting step of carrying out the error detecting operation again with respect to at least one packet of the basic data that includes the basic data portion of a retransmitted packet, when the packet for which the retransmission request was made is retransmitted from the sending side; and a repeat of the error detecting step of again carrying out the error detecting operation with respect to the overall basic data that includes a data portion of the retransmitted packet, with use of the error correcting code including the basic data and the parity code, when errors are found as a result of the repeat of the first error correcting step.

17. The digital communications method as defined in claim 15, wherein the error correcting code is a BCH code.

18. The digital communications method as defined in claim 15, wherein the error detecting code is a CRC code.

19. The digital communications method as defined in claim 15, wherein the basic data is a video signal, and the basic data is transmitted and received in accordance with a TDMA/TDD method in the transmission and receiving steps.

20. The digital communications method as defined in claim 16, wherein the error correcting code is a BCH code.

21. The digital communications method as defined in claim 16, wherein the error detecting code is a CRC code.

22. The digital communications method as defined in claim 16, wherein the basic data is a video signal, and the basic data is transmitted and received in accordance with a TDMA/TDD method in the transmission and receiving steps.

23. A data receiving apparatus that receives data complete with a parity code and an error detecting code, comprising:

a receiving circuit for receiving transmission data that comprises smaller packets, each having an error detecting code, into which an error correcting code including basic data and a parity code appended thereto is divided;

an error correcting circuit for carrying out an error correcting operation with respect to the overall received basic data using the error correcting code;

an error detecting circuit for carrying out an error detecting operation with respect to at least one packet of the error-corrected basic data; and a transmission circuit for requesting retransmission of at least one of the packets found to contain an error, from the sending side.

24. The data receiving apparatus as defined in claim 23, wherein if the packet for which the retransmission request was made is retransmitted from the sending side, and the receiving circuit receives that retransmitted packet, the error correcting circuit carries out the error correcting operation again with respect to the overall basic data that includes the basic data portion of the retransmitted packet, with use of the error correcting code including the basic data and the parity code;

the error detecting circuit carries out the error detecting operation again with respect to at least one packet of the basic data subjected to the repeat of error correction; and the transmission circuit sends a request for retransmission of at least one of the packets found to contain errors as a result of the repeat of error correction, to the sending side.

25. The data receiving apparatus as defined in claim 23, wherein the error correcting code is a BCH code.

26. The data receiving apparatus as defined in claim 23, wherein the error detecting code is a CRC code.

27. The data receiving apparatus as defined in claim 23, wherein the basic data is a video signal, and the receiving circuit receives the transmission data in accordance with a TDMA/TDD method.

28. The data receiving apparatus as defined in claim 24, wherein the error correcting code is a BCH code.

29. The data receiving apparatus as defined in claim 24, wherein the error detecting code is a CRC code.

30. The data receiving apparatus as defined in claim 24, wherein the basic data is a video signal, and the receiving circuit receives the transmission data in accordance with a TDMA/TDD method.

31. A data receiving apparatus that receives data complete with a parity code and an error detecting code, comprising:

a receiving circuit for receiving transmission data that comprises smaller packets, each having an error detecting code, into which an error correcting code including basic data and a parity code appended thereto is divided;

a first error detecting circuit for carrying out an error detecting operation with respect to at least one packet of the received basic data;

an error correcting circuit for carrying out an error correcting operation with respect to the overall basic data using an error correcting code when the packet is found to contain an error in the first error detecting step:

a second error detecting circuit for carrying out an error detecting operation with respect to at least one packet of the error-corrected basic data; and a transmission circuit for requesting retransmission of at least one of the packets found to contain an error, from the sending side.

32. The data receiving apparatus as defined in claim 31, wherein if the packet for which the retransmission request was made is retransmitted from the sending side, and the receiving circuit receives that retransmitted packet, the first error detecting circuit carries out the error detecting operation again with respect to at least one packet of the basic data that contains the retransmitted packet;

the error correcting circuit carries cut the error correcting operation again with respect to the overall basic data that contains the basic data portion of the retransmitted packet, with use of the error correcting code including the basic data and the parity code, when the packet is found to still contain an error as a result of the repeat of the error correcting operation;

the second error detecting circuit carries out an error detecting operation again with respect to at least one packet of the basic data subjected to the repeat of error correction; and the transmission circuit requests retransmission of at least one of the packets found to contain an error, from the sending side, if the packets are found to contain errors as a result of the repeat of error detection.

33. The data receiving apparatus as defined in claim 31, wherein the error correcting code is a BCH code.

34. The data receiving apparatus as defined in claim 31, wherein the error detecting code is a CRC code.

35. The data receiving apparatus as defined in claim 31, wherein the basic data is a video signal, and the receiving circuit receives the transmission data in accordance with a TDMA/TDD method.

36. The data receiving apparatus as defined in claim 32, wherein the error correcting code is a BCH code.

37. The data receiving apparatus as defined in claim 32, wherein the error detecting code is a CRC code.

38. The data receiving apparatus as defined in claim 32, wherein the basic data is a video signal, and the receiving circuit receives the transmission data in accordance with a TDMA/TDD method.

* * * * *